(12) United States Patent
Shin et al.

(10) Patent No.: US 9,887,831 B2
(45) Date of Patent: Feb. 6, 2018

(54) CLOCK DATA RECOVERY CIRCUIT, INTEGRATED CIRCUIT INCLUDING THE SAME, AND CLOCK DATA RECOVERY METHOD

(71) Applicant: SK hynix Inc., Gyeonggi-do (KR)

(72) Inventors: Woo-Yeol Shin, Gyeonggi-do (KR); Myeong-Jae Park, Gyeonggi-do (KR); Kyu-Young Kim, Gyeonggi-do (KR); Han-Kyu Chi, Gyeonggi-do (KR); Sung-Eun Lee, Gyeonggi-do (KR); Kyung-Hoon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/206,046

(22) Filed: Jul. 8, 2016

(65) Prior Publication Data

US 2017/0237550 A1    Aug. 17, 2017

(30) Foreign Application Priority Data

Feb. 15, 2016   (KR) .................. 10-2016-0017027

(51) Int. Cl.
*H03D 3/24* (2006.01)
*H04L 7/033* (2006.01)
*H03L 7/081* (2006.01)
*H04L 7/00* (2006.01)

(52) U.S. Cl.
CPC ............ *H04L 7/0331* (2013.01); *H03L 7/081* (2013.01); *H04L 7/0337* (2013.01); *H04L 7/0025* (2013.01)

(58) Field of Classification Search
CPC ... H04L 7/0331; H04L 7/0025; H04L 7/0337; H03L 7/08
USPC ......................................... 375/376
See application file for complete search history.

(56) References Cited

U.S. PATENT DOCUMENTS

| | | | |
|---|---|---|---|
| 2005/0013389 A1* | 1/2005 | Mizukami | H04L 27/2271 375/323 |
| 2006/0193419 A1* | 8/2006 | Maneatis | H03L 7/07 375/376 |
| 2007/0047686 A1* | 3/2007 | Aoki | H03L 7/0814 375/374 |
| 2007/0153837 A1* | 7/2007 | Meir | H03L 7/0812 370/503 |

(Continued)

FOREIGN PATENT DOCUMENTS

KR    1020070088205    8/2007

*Primary Examiner* — Leila Malek
(74) *Attorney, Agent, or Firm* — IP & T Group LLP

(57) ABSTRACT

A clock data recovery circuit may include: a phase comparison unit suitable for comparing input data with a phase of a multi-phase clock, and for generating an up/down signal corresponding to the comparison result; a filtering unit suitable for counting the up/down signal based on an upper threshold value and a lower threshold value, for setting, when an overflow occurs, the lower threshold value to an initial value for the count of the up/down signal, or when a underflow occurs, the upper threshold value to the initial value for the count of the up/down signal, and for generating a control code corresponding to one of the underflow and the overflow; and a phase rotating unit suitable for adjusting the phase of the multi-phase clock in response to the control code outputted from the filtering unit.

16 Claims, 10 Drawing Sheets

(56) References Cited

U.S. PATENT DOCUMENTS

| | | | |
|---|---|---|---|
| 2007/0164835 A1* | 7/2007 | Co | H03C 3/0966 332/144 |
| 2010/0011265 A1* | 1/2010 | Tamura | G06F 12/00 714/734 |
| 2013/0069700 A1 | 3/2013 | Wang et al. | |

* cited by examiner

CLOCK DATA RECOVERY CIRCUIT, INTEGRATED CIRCUIT INCLUDING THE SAME, AND CLOCK DATA RECOVERY METHOD

CROSS-REFERENCE TO RELATED APPLICATION

This application claims priority under 35 U.S.C. § 119 to Korean Patent Application No. 10-2016-0017027, filed on Feb. 15, 2016, in the Korean Intellectual Property Office, which is incorporated herein by reference in its entirety.

TECHNICAL FIELD

Exemplary embodiments relate to a semiconductor design technology and, more particularly, to a clock data recovery (CDR) circuit.

DISCUSSION OF THE RELATED ART

Generally, a system performing serial data communication through a small number of data buses uses a clock data recovery method. The clock data recovery method generates a clock signal to be a reference from serial data, and uses the generated clock signal as a strobe signal for receiving data. Therefore, generally a transmitter may transmit data having information related to the clock signal, and a receiver may include therein a clock data recovery (CDR) circuit for generating a clock signal from the data and receive, in synchronization with the generated clock signal, data transmitted from the transmitter.

Typically, for minimizing signal distortion due to a noise or jitter and increasing a valid window for the data, the CDR circuit of the receiver compares the phase of the clock signal generated from the inputted clock signal data with a transition time of the inputted data and adjusts the phase of the clock signal.

FIG. 1 is a block diagram illustrating a conventional CDR circuit 10.

Referring to FIG. 1, the CDR circuit 10 includes a sampler 12, a phase detector 14, a digital loop filter (DLF) 16 and a phase rotator 18.

The sampler 12 samples input data DIN using a multi-phase clock R_CLK<0:15> provided from the phase rotator 18, and outputs phase shift information. Furthermore, the sampler 12 samples the input data DIN according to the multi-phase clock R_CLK<0:15> and generates output data DOUT. The phase detector 14 receives the phase shift information outputted from the sampler 12, and outputs an up/down signal UP/DN corresponding to a period in which data transition occurs. The DLF 16 may be implemented with a filtering circuit, and receives the up/down signal UP/DN outputted from the phase detector 14, and outputs a control code CTRL<0:m> for controlling the operation of the phase rotator 18. The phase rotator 18 receives a clock CLK<0:15> from a clock generator (not shown) such as a phase lock loop (PLL), generates the multi-phase clock R_CLK<0:15>, and adjusts the phase of the multi-phase clock R_CLK<0:15> in response to the control code CTRL<0:m> outputted from the DLF 16.

As described above, the CDR circuit 10 receives the input data DIN and outputs the output data DOUT using the multi-phase clock R_CLK<0:15> having a phase adjusted depending on the phase of the input data DIN.

In the CDR circuit 10, a delay time of several cycles required for the DLF 16 to perform digital filtering is called loop latency. Due to such loop latency, a limit-cycle phenomenon (i.e., a bang-bang error) is exacerbated, and the jitter of the CDR circuit 10 is accordingly increased. In the DLF 16, to reduce the limit-cycle phenomenon, only when several up/down signals UP/DN are collected and the number thereof becomes a predetermined number or more, the control code CTRL<0:m> is provided to the phase rotator 18. In other words, the DLF 16 counts the up/down signal UP/DN and is able to provide the control code CTRL<0:m> only when an underflow or overflow occurs. Thereafter, the DLF 16 initializes a counter provided therein, and then counts a next up/down signal UP/DN.

However, in a state in which the counter provided in the DLF 16 has been initialized, when the phase of the multi-phase clock R_CLK<0:15> of the CDR circuit 10 fluctuates due to a noise generated from the input data DIN or a random noise generated from the phase rotator 18 itself, many cycles are consumed to recover the phase, and a lot of operating time is thus required.

SUMMARY

Various embodiments are directed to a clock data recovery (CDR) circuit capable of being rapidly recovered, when a noise occurs, to its original state by initializing, using a lower threshold value and an upper threshold value, a counter provided in a digital loop filter, and an integrated circuit including the same, and a CDR method.

Also, various embodiments are directed to a CDR circuit capable of realizing the same CDR bandwidth (BW) as that of a conventional circuit despite using a counter having a depth of ½ of that of the conventional circuit, and an integrated circuit including the same, and a CDR method.

In an embodiment, a clock data recovery circuit may include: a phase comparison unit suitable for comparing input data with a phase of a mufti-phase clock, and for generating an up/down signal corresponding to the comparison result; a filtering unit suitable for counting the up/down signal based on an upper threshold value and a lower threshold value, for setting, when an overflow occurs, the lower threshold value to an initial value for the count of the up/down signal, or when a underflow occurs, the upper threshold value to the initial value for the count of the up/down signal and for generating a control code corresponding to one of the underflow and the overflow; and a phase rotating unit suitable for adjusting the phase of the multi-phase clock in response to the control code outputted from the filtering unit.

In an embodiment, an integrated circuit may include: an up/down signal generation unit suitable for comparing a reference signal and a feedback signal and for generating an up/down signal including phase shift information; an underflow/overflow prediction unit suitable for predicting, based on the up/down signal and a sum signal, an underflow/overflow and for generating a control code, and for outputting a select signal for selecting a lower threshold value when the overflow occurs, and for selecting an upper threshold value when the underflow occurs; a counting unit suitable for counting, based on the upper threshold value and the lower threshold value, the up/down signal and for outputting the sum signal, and for setting, when the underflow or overflow occurs, an initial value of the sum signal in response to the select signal; and a feedback unit suitable for generating the feedback signal in response to the control code.

In an embodiment, a clock data recovery method may include: comparing input data and a phase of a multi-phase clock and generating an up/down signal corresponding to the comparison result; counting the up/down signal based on an upper threshold value and a lower threshold value and outputting a sum signal; predicting, based on the up/down signal and the sum signal, an underflow/overflow and generating a control code; and adjusting the multi-phase clock in response to the control code, wherein the lower threshold value is set to an initial value of the sum signal when the overflow occurs, and the upper threshold value is set to an initial value of the sum signal when the underflow occurs.

When the up/down signal indicating an up state is inputted in a state in which the sum signal has reached the upper threshold value, the control code indicating occurrence of the overflow may be generated, and the lower threshold value may be set to the initial value of the sum signal. When the up/down signal indicating a down state is inputted in a state in which the sum signal has reached the upper threshold value, the control code indicating occurrence of the underflow may be generated, and the upper threshold value may be set to the initial value of the sum signal. The comparing of the input data and the phase of the multi-phase clock and the generating of the up/down signal corresponding to the phase shift information may comprise: sampling the input data using the multi-phase clock and outputting the phase shift information; and receiving the phase shift information and generating the up/down signal corresponding to a period in which data transition occurs.

In an embodiment, a clock data recovery circuit may include: a data transition detection unit suitable for receiving input data, detecting transition of the input data based on a multi-phase clock, and generating transition information indicating the transition of the input data; a digital unit suitable for counting the transition information, and generating one of overflow information and underflow information, the overflow information indicating an overflow corresponding that the transition information is counting by an upper threshold value and the overflow information indicating an underflow corresponding that the transition information is counting by a lower threshold value; and a phase adjusting unit suitable for adjusting the phase of the multi-phase clock for controlling timing of output data corresponding to the input data based on the one of the overflow information and the underflow information, wherein the digital unit is configured to set the lower threshold value to an initial value for the counting when the overflow occurs, and set the upper threshold value to the initial value of the counting when an underflow occurs.

DETAILED DESCRIPTION

Figure 1:
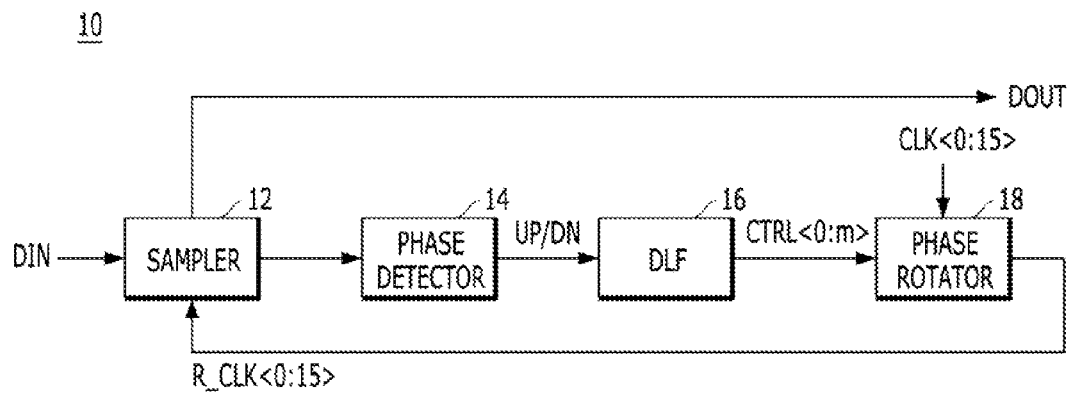
FIG. 1 is a block diagram illustrating a general clock data recovery (CDR) circuit.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

Figure 2:
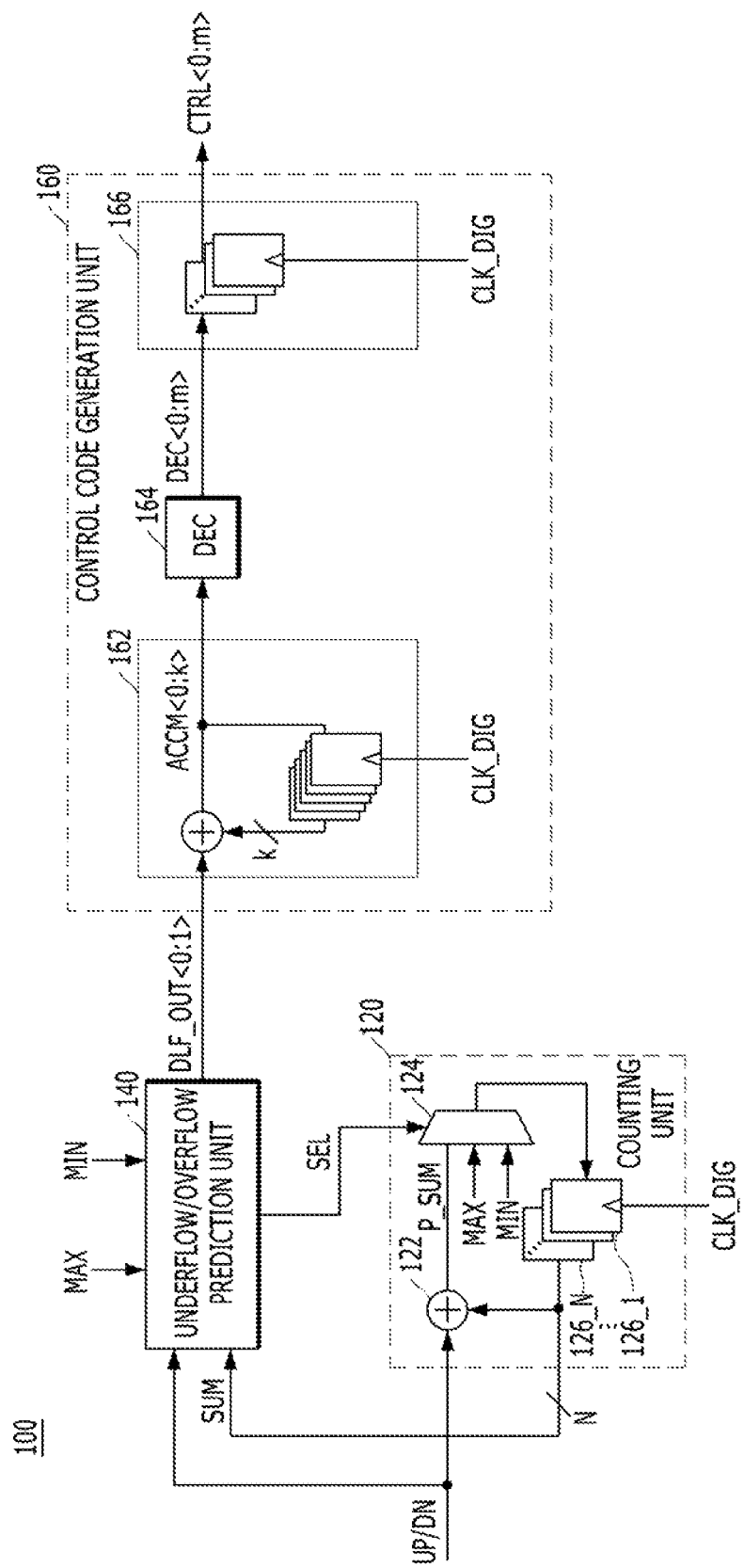
FIG. 2 is a circuit diagram illustrating a digital loop filter (DLF), according to an embodiment of the present invention.

FIG. 2 illustrates a digital loop filter DLF 100, according to an embodiment of the present invention.

According to the embodiment of FIG. 2 the DLF 10 may include a counting unit 120, an underflow/overflow prediction unit 140, and a control code generation unit 160.

The underflow/overflow prediction unit 140 predicts, based on an up/down signal UP/DN and a sum signal SUM, an underflow/overflow and generates a loop output signal DLF OUT<0:1> indicating occurrence of an underflow or overflow. Furthermore, the underflow/overflow prediction unit 140 outputs a select signal SEL for selecting one of a lower threshold value MIN and an upper threshold value MAX. For example, when an overflow occurs, the underflow/overflow prediction unit 140 outputs the select signal SEL for selecting the lower threshold value MIN. Also, for example, when an underflow occurs, the underflow/overflow prediction unit 140 outputs the select signal SEL for selecting the upper threshold value MAX. In more detail, the underflow/overflow prediction unit 140 may generate, when an up/down signal UP/DN indicating an up state is inputted in a state in which the sum signal SUM has reached the upper threshold value MAX, a loop output signal DLF_OUT<0:1> indicating occurrence of an overflow and output a select signal SEL for selecting the lower threshold value MIN. In addition, the underflow/overflow prediction unit 140 may generate, when an up/down signal UP/DN indicating a down state is inputted in a state in which the sum signal SUM has reached the lower threshold value MIN, a loop output signal DLF_OUT<0:1> indicating occurrence of an underflow and output a select signal SEL for selecting the upper threshold value MAX.

The counting unit 120 counts the up/down signal UP/DN based on the upper threshold value MAX and the lower threshold value MIN, and output the sum signal SUM. Furthermore, the counting unit 120 sets an initial value of the sum signal SUM in response to the select signal SEL when an underflow or overflow occurs. For reference, the up/down signal UP/DN may be a signal that is outputted from a phase detector (e.g., the phase detector 14 of FIG. 1) and inputted to the DLF 100. The up/down signal UP/DN may include phase shift information.

In more detail, according to the embodiment of FIG. 2, the counting unit 120 may include an adder 122, a multiplexer 124, and a plurality of flip-flops 126_1 to 126_N.

The adder 122 adds the up/down signal UP/DN and the sum signal SUM and outputs a preliminary sum signal P_SUM. The multiplexer 124 then selects and outputs, in response to the select signal SEL outputted from the underflow/overflow prediction unit 140, any one of the preliminary sum signal P_SUM, the lower threshold value MIN and the upper threshold value MAX. The plurality of flip-flops 126_1 to 126_N latch an output signal of the multiplexer 124 in synchronization with a digital operating clock CLK_DIG and output the sum signal SUM. In the embodiment of FIG. 2, it is illustrated, as an example, the case where each of the preliminary sum signal P_SUM and the sum signal SUM is a signal constructed by eight bits (i.e., N=8) and, accordingly, the plurality of flip-flops 126_1 to 126_N are eight flip-flops 126_1 to 126_8. However, the invention is not limited in this way.

As described above, the counting unit 120 adds, when the up/down signal UP/ON is inputted, the up/down signal UP/DN and the preliminary sum signal P_SUM that has been previously calculated, and outputs the sum signal SUM. When a select signal SEL indicating occurrence of an overflow is inputted from the underflow/overflow prediction unit 140, the lower threshold value MIN is outputted as the initial value of the sum signal SUM. When a select signal SEL indicating occurrence of an underflow is inputted from the underflow/overflow prediction unit 140, the upper threshold value MAX is outputted as the initial value of the sum signal SUM.

The control code generation unit 160, according to the embodiment of FIG. 2, outputs a control code CTRL<0:m> based on the loop output signal DLF_OUT<0:1>.

The control code generation unit 160 may include an accumulator 162, a decoder 164, and an output unit 166.

The accumulator 162 accumulates and adds loop output signals DLF_OUT<0:1> in synchronization with the digital operating clock CLK_DIG. The accumulator 162 then outputs an accumulation signal ACCM<0:k>. In an embodiment, the accumulator 162 may add, in synchronization with the digital operating clock CLK_DIG, a previous accumulation value of a two-bit loop output signal DLF_OUT<0:1> and a current value of the two-bit loop output signal DLF_OUT<0:1> and generate a five-bit accumulation signal ACCM<0:5> (that is, k=5).

The decoder 164 decodes the accumulation signal ACCM<0:k> and generates a decoded signal DEC<0:m>. The output unit 166 synchronizes the decoded signal DEC<0:m> with the digital operating clock CLK_DIG and outputs the control code CTRL<0:m>.

Figure 3:
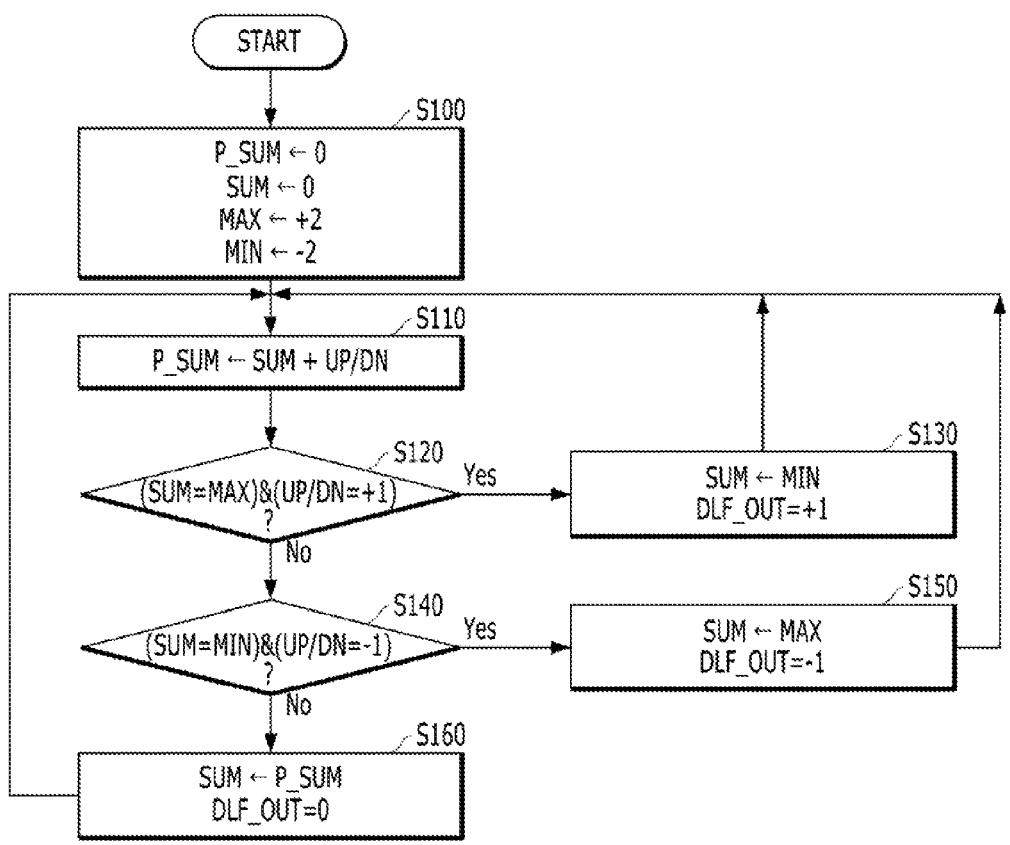
FIG. 3 is a flowchart illustrating an algorithm of the digital loop filter (DLF) shown in FIG. 2.

FIG. 3 is a flowchart illustrating an algorithm of the digital loop filter (DLF) 100 shown in FIG. 2.

Referring to FIG. 3 first, initial values of the respective signals are set at step S100. For example, the preliminary sum signal P_SUM may be set to '0', the sum signal SUM may be set to '0', the upper threshold value MAX may be set to '+2', and the lower threshold value MIN may be set to '−2'. The upper threshold value MAX and the lower threshold value MIN may be set depending on design options.

For reference, the up/down signal UP/DN may be constructed by a two-bit signal and be set as follows.

TABLE 1

| DN | UP | OUTPUT VALUE | STATE |
|----|----|--------------|-------|
| 0  | 0  | 0            | NOP   |
| 0  | 1  | +1           | UP    |
| 1  | 0  | −1           | DOWN  |
| 1  | 1  | X            | —     |

Like rise, the two-bit loop output signal DLF_OUT<0:1> may be set as follows.

TABLE 2

| DLF_OUT<1> | DLF_OUT<0> | OUTPUT VALUE | STATE     |
|------------|------------|--------------|-----------|
| 0          | 0          | 0            | NO FLOW   |
| 0          | 1          | +1           | OVERFLOW  |
| 1          | 0          | −1           | UNDERFLOW |
| 1          | 1          | X            | —         |

The counting unit 120 adds the up/down signal UP/DN and the sum signal SUM and outputs the preliminary sum signal P_SUM at step S110.

The underflow/overflow prediction unit 140 predicts, based on the up/down signal UP/DN and the sum signal SUM, an underflow/overflow and generates a loop output signal DLF OUT<0:1> indicating an underflow or an overflow.

In this regard when an up/down signal UP/DN indicating an up state (i.e., '+1') is inputted in a state in which the sum signal SUM has reached the upper threshold value MAX at step S120, the underflow/overflow prediction unit 140 generates a loop output signal DLF_OUT<0:1> indicating occurrence of an overflow (i.e., '+1'), and outputs a select signal SEL for selecting the lower threshold value MIN, and the counting unit 120 enables the sum signal SUM to be initialized to the lower threshold value MIN in response to the select signal SEL at step S130.

On the other hand, when an up/down signal UP/DN indicating a down state (i.e., '−1') is inputted in a state in which the sum signal SUM has reached the lower threshold value MIN at step S140, the underflow/overflow prediction unit 140 generates a loop output signal DLF_OUT<0:1> indicating occurrence of an underflow (i.e., '−1'), and outputs a select signal SEL for selecting the upper threshold value MAX, and the counting unit 120 enables the sum signal SUM to be initialized to the upper threshold value MAX in response to the select signal SEL at step S150.

If the sum signal SUM is not in a state in which it has reached the upper threshold value MAX or the lower threshold value MIN, the underflow/overflow prediction unit 140 generates a loop output signal DLF_OUT<0:1> indicating occurrence of no-flow (i.e. '0'), and outputs a select signal SEL for selecting a preliminary sum signal P_SUM, and the counting unit 120 enables the preliminary sum signal P_SUM to be outputted as the sum signal SUM in response to the select signal SEL at step S160.

The above-mentioned operations S110 to S160 may be continuously repeated.

The control code generation unit 160 may output the control code CTRL<0:m> based on the loop output signal DLF_OUT<0:1> outputted from the underflow/overflow prediction unit 140.

The conventional DLF counts the up/down signal UP/DN based on the upper threshold value MAX and the lower threshold value MIN and outputs the sum signal SUM, but initialize, when an underflow/overflow occurs, the sum signal SUM to a center value (I.e., a value of '0'). On the other hand, the inventive DLF 100 according to the embodiment of FIG. 2, counts the up/down signal UP/DN based on the upper threshold value MAX and the lower threshold value MIN and outputs the sum signal SUM, but also initializes, when an overflow occurs, the sum signal SUM to the lower threshold value MIN and initializes, when an underflow occurs, the sum signal SUM to the upper threshold value MAX. Therefore, through improvement in the underflow/overflow processing algorithm of an internal counter (i.e., counting unit 120) of the DLF 100, the operating speed is improved, and jitter and a bit error rate (BER) can be reduced. Furthermore, despite using a counter having a depth of ½ of that of the conventional circuit, it is possible to realize the same CDR bandwidth (BW) as that of the conventional circuit, whereby the entire area of the CDR circuit can be reduced.

Figure 4:
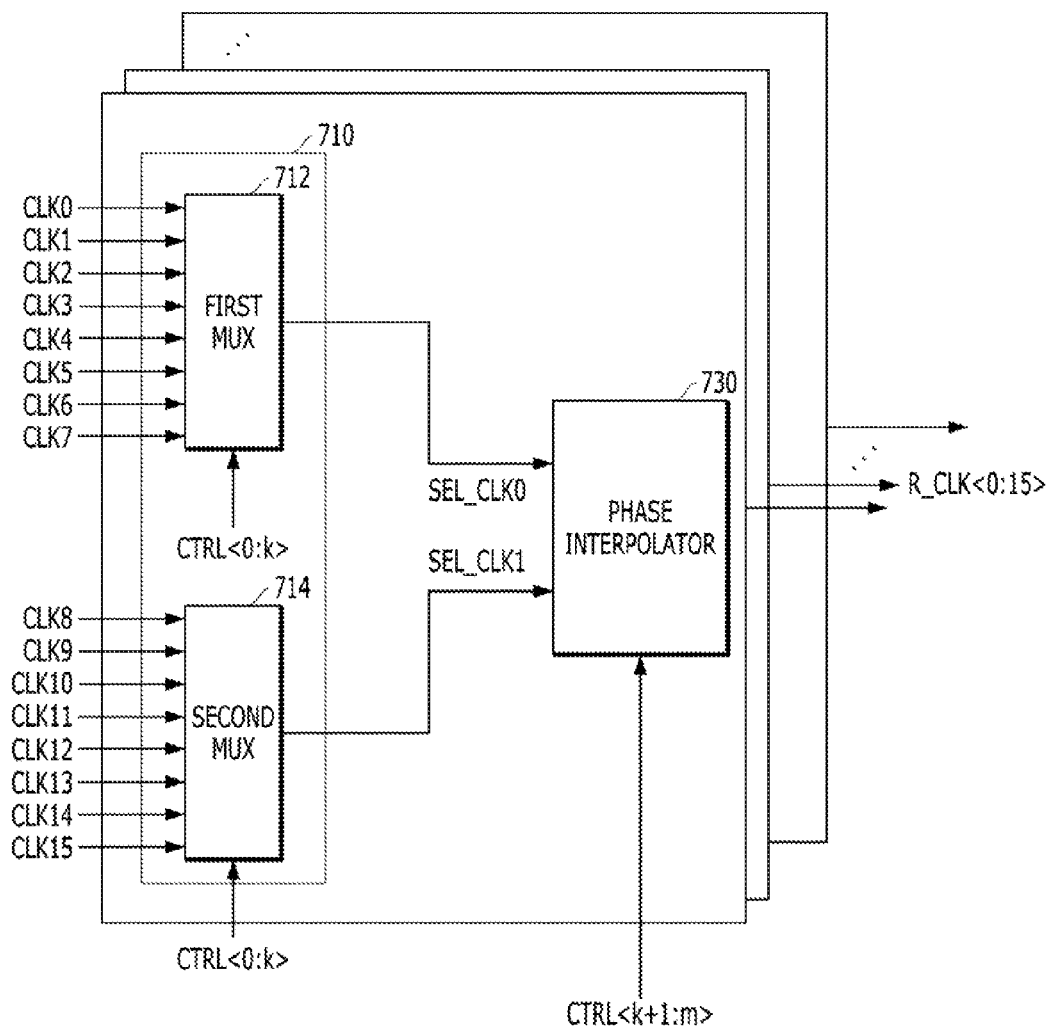
FIG. 4 is a block diagram illustrating a phase rotating unit, according to an embodiment of the present invention.

FIG. 4 is a block diagram illustrating a phase rotating unit 200 according to an embodiment of the present invention.

Referring to FIG. 4, the phase rotating unit 200 receives a clock CLK<0:15> and generates a multi-phase clock R_CLK<0:15>. The phase rotating unit 200 also controls the phase of the multi-phase clock R_CLK<0:15> in response to a control code CTRL<0:m> so that the multi-phase clock R_CLK<0:15> can be shifted to an optimum sampling position for the input data DIN.

According to the illustrated embodiment of FIG. 4, the phase rotating unit 200 may include a clock selector 710 and a phase interpolator 730.

The clock selector 710 selects, in response to some of the bits CTRL<0:k> of the control code CTRL<0:m> (k is an integer greater than 0 and less than m), two clocks among a plurality of input clocks CLK0 to CLK15 and outputs them as first and second selected clocks SEL_CLK0 and SEL_CLK1. The clock selector 710 may include a first multiplexer (MUX) 712 and a second MUX 714. The first MUX 712 selects, in response to the bits CTRL<0:k>, one clock among a plurality of input clocks CLK0 to CLK7 and outputs the selected clock as the first selected clock SEL_CLK0. The second MUX 714 selects, in response to the bits CTRL<0:k>, one clock among a plurality of input clocks CLK8 to CLK15 and outputs the selected clock as the second selected clock SEL_CLK1.

The phase interpolator 730 mixes the first and second selected clocks SEL_CLK0 and SEL_CLK1 and generates a multi-phase clock R_CLK<0:15>. The phase interpolator 730 may mix the first and second selected clocks SEL_CLK0 and SEL_CLK1 at a mixing ratio determined by the other bits CTRL<k+1:m> of the control code CTRL<0:m>. The multi-phase clock R_CLK<0:15> may have a phase between the first select clock SEL_CLK0 and the second selected clock SEL_CLK1, and this phase may be determined depending on the mixing ratio.

Hereinafter, with reference to FIGS. 5A to 7B, an operation of the DLF 100 described with reference to FIGS. 1 to 4 will be explained.

Figure 5A:
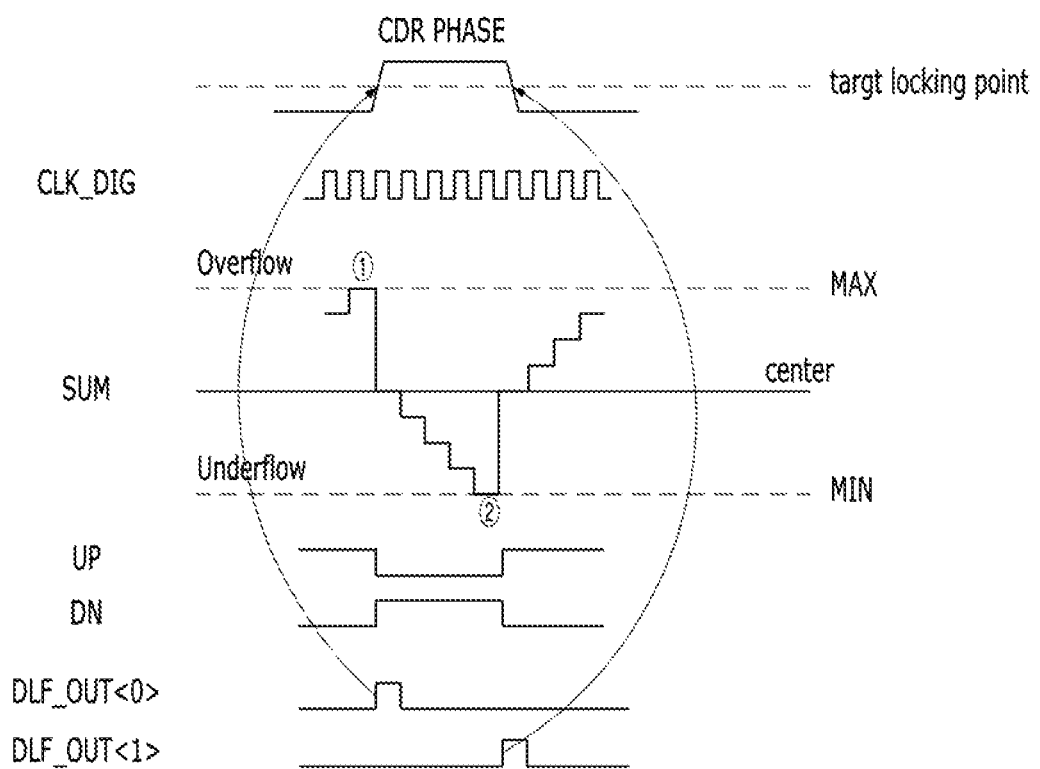
FIGS. 5A and 5B are waveform diagrams illustrating the operation of the conventional digital loop filter (DLF) and of an inventive DLF, according to an embodiment of the present invention, respectively, under a first condition.
Figure 5B:
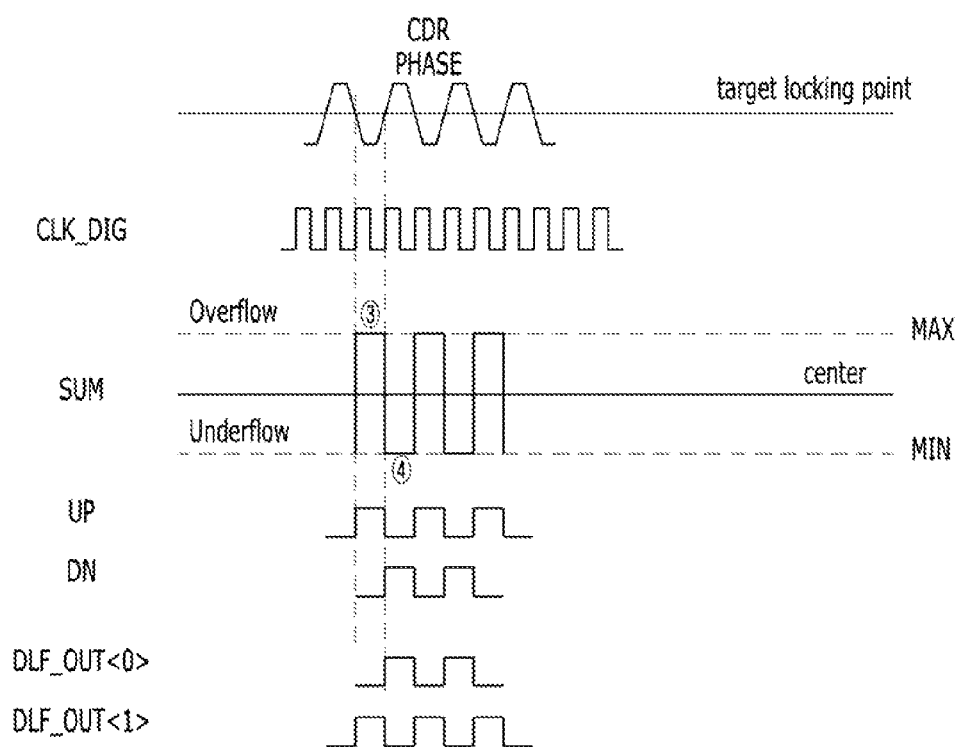

FIGS. 5A and 5B are waveform diagrams illustrating the operation of the conventional DLF and the inventive DLF 100, respectively, under a first condition. For example, the first condition may refer to a condition in which no noise is introduced while loop latency is "0". In each drawing, the term 'CDR PHASE' means a degree with which a phase (hereinafter, referred to as a 'CDR phase') of a multi-phase clock R_CLK<0:15> of a CDR circuit 10 is displaced from a target locking point, i.e., a phase of an input data DIN).

First, referring to FIG. 5A, there is illustrated the operation of the conventional DLF under the first condition. In the case where the CDR phase follows the target locking point, an up/down signal UP/DN indicating an up state is inputted, it is counted and a sum signal SUM is generated. At time ①, if the up/down signal UP/DN indicating the up state is inputted in a state in which the sum signal SUM has reached the upper threshold value MAX, a loop output signal DLF_OUT<0:1> indicating occurrence of an overflow is generated. Accordingly, the sum signal SUM is initialized to '0', and the CDR phase is adjusted.

In the case where the CDR phase precedes the target locking point, an up/down signal UP/DN indicating a down state is inputted, it is counted and a sum signal SUM is generated. At time Z, if the up/down signal UP/DN indicating the down state is inputted in a state in which the sum signal SUM has reached the lower threshold value MIN, a loop output signal DLF_OUT<0:1> indicating occurrence of an underflow is generated. Accordingly, the sum signal SUM is initialized to '0', and the CDR phase is adjusted.

Referring to FIG. 5B, there is illustrated an operation of the DLF 100, according to the embodiment of FIG. 2, under the first condition. First, in the case where the CDR phase follows the target locking point, an up/down signal UP/DN indicating an up state is inputted, it is counted and a sum signal SUM is generated. At time ③, if the up/down signal UP/DN indicating the up state is inputted in a state in which the sum signal SUM has reached the upper threshold value MAX, a loop output signal DLF_OUT<0:1> indicating occurrence of an overflow (i.e., DLF_OUT<1>) is generated. Accordingly, the sum signal SUM is initialized to the lower threshold value MIN, and the CDR phase is adjusted. Thereafter, at time ④, if the up/down signal UP/DN indicating the down state is inputted in a state in which the sum signal SUM has been initialized to the lower threshold value MIN, a loop output signal DLF_OUT<0:1> indicating occurrence of an underflow (i.e., DLF_OUT<0>) is generated. Accordingly, the sum signal SUM is initialized to the upper threshold value MAX, and the CDR phase is adjusted.

As described above, in the case of the DLF 100 shown in FIG. 5B, the repetition period of the up/down signal UP/DN is short compared to that of the conventional DLF shown in FIG. 5A. Therefore, even when the CDR phase is displaced from the target locking point, it can be rapidly recovered to its original state. Furthermore, in the case of the conventional DLF shown in FIG. 5A, when an overflow or an underflow occurs, the sum signal SUM is initialized to '0', whereby tracking is restarted. Therefore, to embody a counter having a CDR bandwidth (BW) of 4, the upper threshold value MAX and the lower threshold value MIN should be respectively set to +4/−4. However, in the case of the DLF 100 shown in FIG. 5B, when an overflow or an underflow occurs, the sum signal SUM is respectively initialized to the lower threshold value MIN or the upper threshold value MAX. Therefore, to embody a counter having the same CDR bandwidth (BW) of 4, the upper threshold value MAX and the lower threshold value MIN may be respectively set to +2/−2. As a result, the DLF 100 is capable of realizing, despite using the counter having a depth of ½ of that of the conventional circuit, the same CDR bandwidth BW as that of the conventional circuit.

Figure 6A:
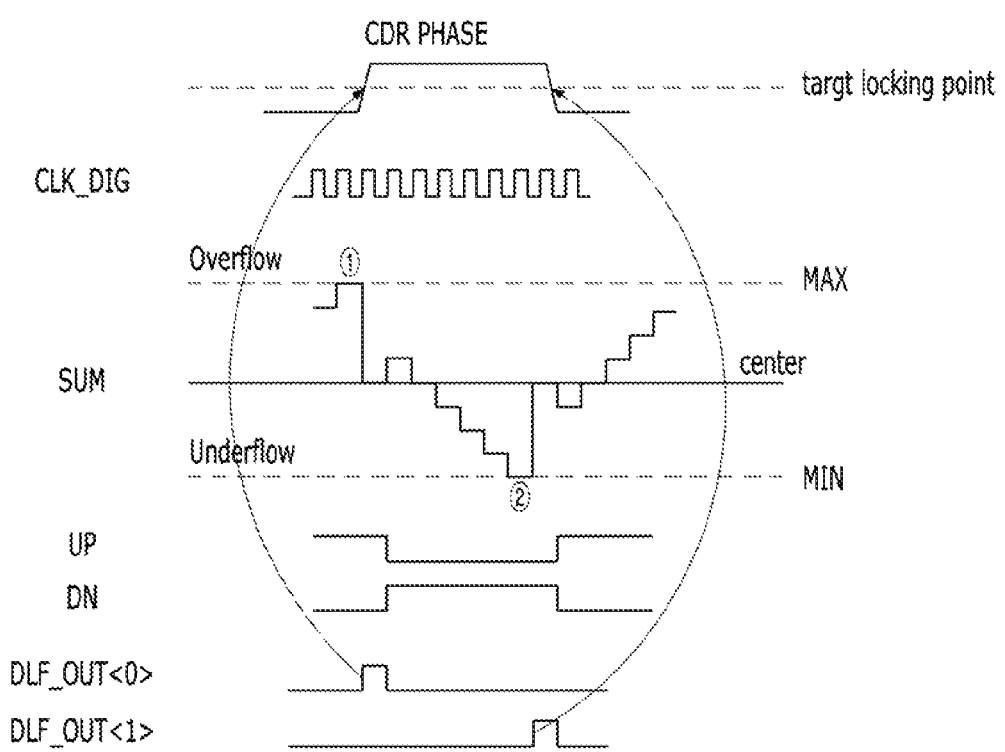
FIGS. 6A and 6B are waveform diagrams illustrating the operation of the conventional DLF and of the inventive DLF, respectively, under a second condition.
Figure 6B:
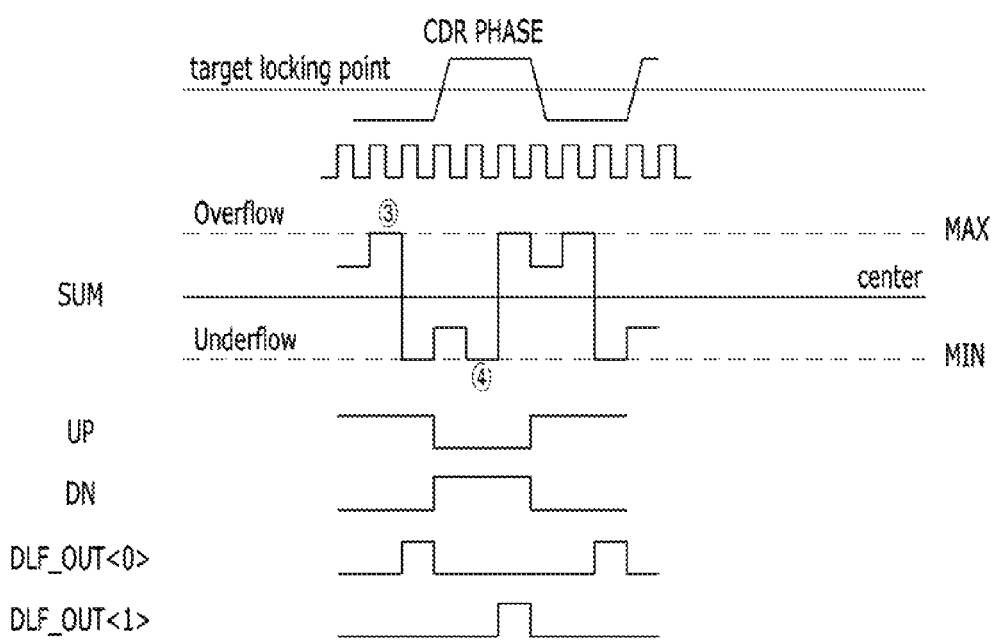

FIGS. 6A and 6B are waveform diagrams illustrating the operation of the conventional DLF and the operation of the inventive DLF 100, respectively, under a second condition. For reference, the second condition may refer to a condition in which no noise is introduced while the loop latency is '1'. In FIGS. 6A and 6B, there is illustrated the case where the CDR phase is adjusted after one cycle after the loop output signal DLF_OUT<0:1> has been outputted by the loop latency '1'.

First, referring to FIG. 6A, there is illustrated the operation of the conventional DLF under the second condition. In the case where the CDR phase follows the target locking point, an up/down signal UP/DN indicating an up state is inputted, it is counted and a sum signal SUM is generated. At time ①, if the up/down signal UP/DN indicating the up state is inputted in a state in which the sum signal SUM has reached the upper threshold value MAX, a loop output signal DLF_OUT<0:1> indicating occurrence of an overflow is generated, whereby the sum signal SUM is initialized to '0'. After one cycle after the loop output signal DLF_OUT<0:1> has been outputted by the loop latency '1', the CDR phase is adjusted.

Subsequently, in the case where the CDR phase precedes the target locking point, an up/down signal UP/DN indicating a down state is inputted, it is counted and a sum signal SUM is generated. At time ②, if the up/down signal UP/DN indicating the down state is inputted in a state in which the sum signal SUM has reached the lower threshold value MIN, a loop output signal DLF_OUT<0:1> indicating occurrence of an underflow is generated, whereby the sum signal SUM is initialized to '0'. After one cycle after the loop output signal DLF_OUT<0:1> has been outputted by the loop latency '1', the CDR phase is adjusted.

Referring to FIG. 6B, there is illustrated an operation of the inventive DLF 100, according to the embodiment of FIG. 2, under the second condition. First, in the case where the CDR phase follows the target locking point, an up/down signal UP/DN indicating an up state is inputted, it is counted and a sum signal SUM is generated. At time ③, if the up/down signal UP/DN indicating the up state is inputted in a state in which the sum signal SUM has reached the upper threshold value MAX, a loop output signal DLF_OUT<0:1> indicating occurrence of an overflow is generated, whereby the sum signal SUM is initialized to the lower threshold value MIN. After one cycle after the loop output signal DLF_OUT<0:1> has been outputted by the loop latency '1', the CDR phase is adjusted. At time ④, if the up/down signal UP/DN indicating the down state is inputted in a state in which the sum signal SUM has reached the lower threshold value MIN, a loop output signal DLF_OUT<0:1> indicating occurrence of an underflow is generated, whereby the sum signal SUM is initialized to the upper threshold value MAX. After one cycle after the loop output signal DLF_OUT<0:1> has been outputted by the loop latency '1', the CDR phase is adjusted.

As described above, in the case of the DLF 100 shown in FIG. 6B, the repetition period of the up/down signal UP/DN is short, despite being under the condition in which the loop latency is present, compared to that of the conventional DLF shown in FIG. 6A. Therefore, even when the CDR phase is displaced from the target locking point, it can be rapidly recovered to its original state. Furthermore, compared to the conventional DLF shown in FIG. 6A, the DLF 100 shown in FIG. 6B is capable of realizing, despite being under the condition in which the loop latency is present and despite using the counter having a depth of ½ of that of the conventional DLF, the same CDR bandwidth BW as that of the conventional circuit.

Figure 7A:
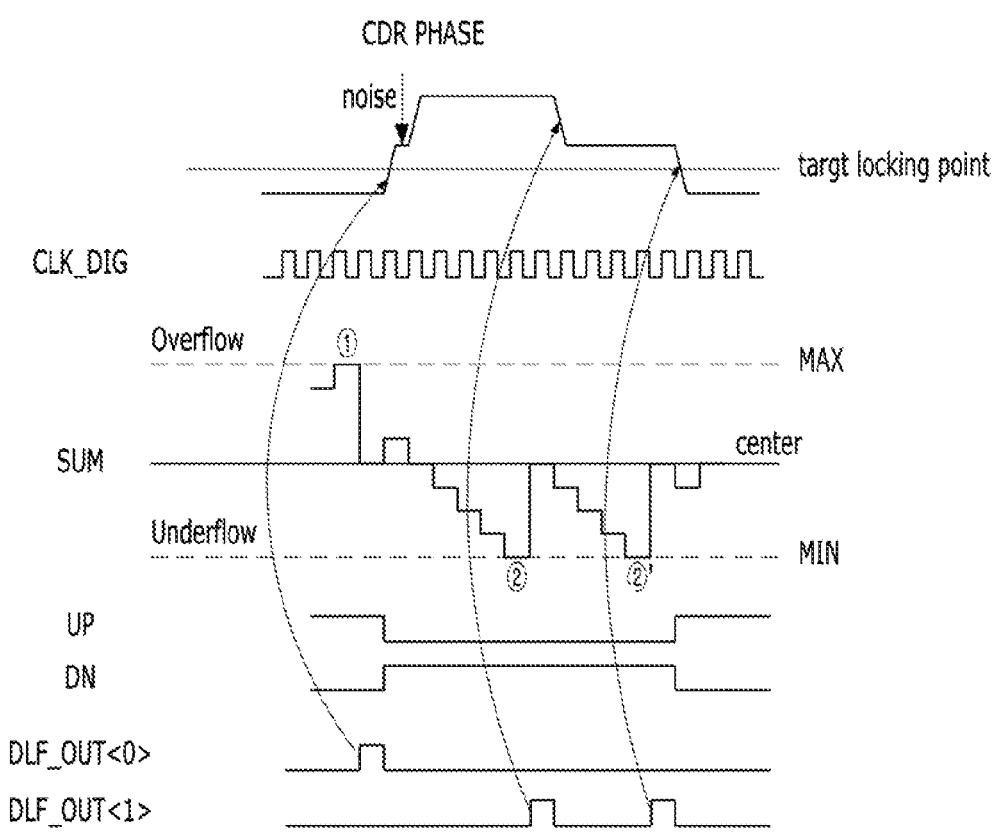
FIGS. 7A and 7B are waveform diagrams illustrating the operation of the conventional DLF and of the inventive DLF, respectively, under a third condition.
Figure 7B:
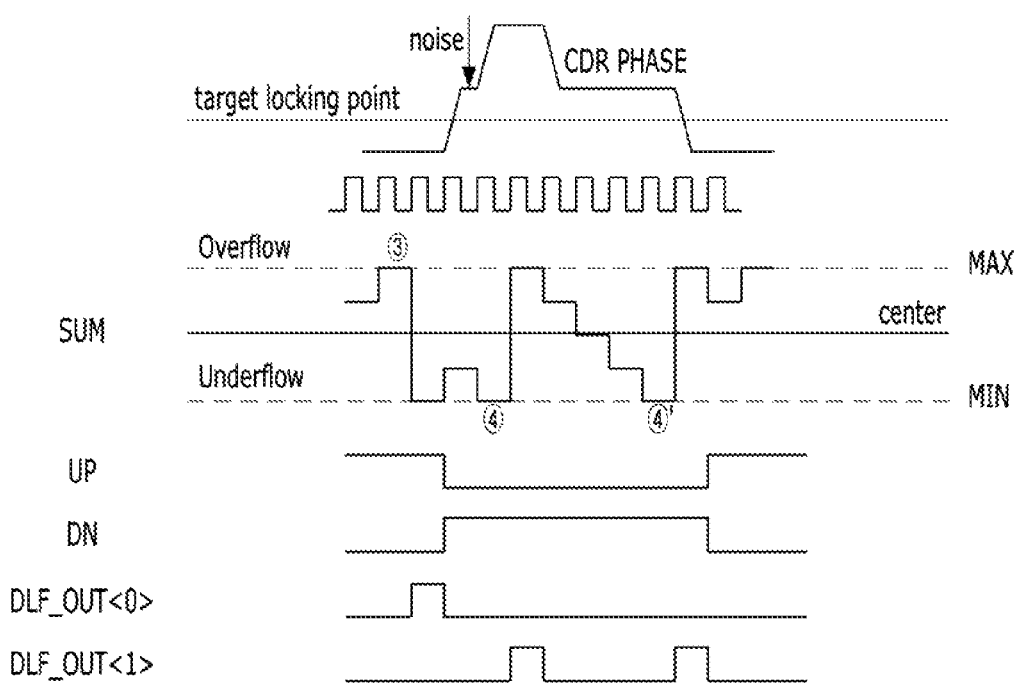

FIGS. 7A and 7B are waveform diagrams illustrating the operation of the conventional DLF and the operation of the inventive DLF 100, respectively, under a third condition. For example, the third condition may refer to a condition in which a noise is introduced while the loop latency is '1'. In FIGS. 7A and 7B, there is illustrated the case where the CDR phase is adjusted after one cycle after the loop output signal DLF_OUT<0:1> has been outputted by the loop latency '1', and where the CDR phase is further displaced from the target locking point by the noise compared to the typical case.

First, referring to FIG. 7A, there is illustrated the operation of the conventional DLF under the third condition. In the case where the CDR phase follows the target locking point, an up/down signal UP/DN indicating an up state is inputted, it is counted and a sum signal SUM is generated. At time ①, if the up/down signal UP/DN indicating the up state is inputted in a state in which the sum signal SUM has reached the upper threshold value MAX, a loop output signal DLF_OUT<0:1> indicating occurrence of an overflow is generated, whereby the sum signal SUM is initialized to '0'. After one cycle after the loop output signal DLF_OUT<0:1> has been outputted by the loop latency '1', the CDR phase is adjusted.

Subsequently, in the case where the CDR phase precedes the target locking point, an up/down signal UP/DN indicating a down state is inputted, it is counted and a sum signal SUM is generated. In this case, if the CDR phase is further displaced from the target locking point by a noise compared to the typical case, the time it takes to recover the CDR phase to the target locking point is increased. That is, at time ②, if the up/down signal UP/DN indicating the down state is inputted in a state in which the sum signal SUM has reached the lower threshold value MIN, an underflow occurs, whereby the sum signal SUM is initialized to '0', and after one cycle, the CDR phase is adjusted. Thereafter, at time ②′, an underflow occurs again, so that the sum signal SUM is initialized to '0', and after one cycle, the CDR phase is adjusted.

Referring to FIG. 7B, there is illustrated an operation of the inventive DLF 100, according to an embodiment of the present invention, under the third condition. In the case where the CDR phase follows the target locking point, an up/down signal UP/DN indicating an up state is inputted, it is counted and a sum signal SUM is generated. At time ③, if the up/down signal UP/DN indicating the up state is inputted in a state in which the sum signal SUM has reached the upper threshold value MAX, a loop output signal DLF_OUT<0:1> indicating occurrence of an overflow is generated, whereby the sum signal SUM is initialized to the lower threshold value MIN. After one cycle after the loop output signal DLF_OUT<0:1> has been outputted by the loop latency '1', the CDR phase is adjusted.

Subsequently, in the case where the CDR phase precedes the target locking point, an up/down signal UP/DN indicating a down state is inputted, it is counted and a sum signal SUM is generated. In this case, if the CDR phase is further displaced from the target locking point by a noise compared to the typical case, the time it takes to recover the CDR phase to the target locking point is increased. That is, at time ④, if the up/down signal UP/DN indicating the down state is inputted in a state in which the sum signal SUM has reached the lower threshold value MIN, an underflow occurs, whereby the sum signal SUM is initialized to '0', and after one cycle, the CDR phase is adjusted. Thereafter, at time ④′, an underflow occurs again, so that the sum signal SUM is initialized to the upper threshold value MAX, and after one cycle, the CDR phase is adjusted.

As described above, in the case of the DLF 100 shown in FIG. 7B, the repetition period of the up/down signal UP/DN is short, despite being under the condition in which a noise is introduced while the loop latency is present, compared to that of the conventional DLF shown in FIG. 7A. Therefore, even when the CDR phase is displaced from the target locking point, it can be rapidly recovered to its original state. Therefore, the operating speed is improved, and jitter and a bit error rate (BER) can be reduced.

Furthermore, compared to the conventional DLF shown in FIG. 7A, the DLF 100 shown in FIG. 7B is capable of realizing, despite being under the condition in which a noise is introduced while the loop latency is present and despite using the counter having a depth of ½ of that of the conventional DLF, the same CDR bandwidth BW as that of the conventional circuit. Therefore, there is an effect of promoting a reduction in the entire area of the CDR circuit.

As described above, according to the described embodiments, a CDR circuit is provided having improved operating speed, reduced jitter and bit error rate (BER). The CDR circuit includes, inter alia, an improved DLF having a counter that employs an improved underflow/overflow processing algorithm.

Furthermore, the CDR circuit can realize, despite using a counter having a depth that is one half (½) of that of the conventional circuit, the same CDR bandwidth (BW) as that of the conventional circuit, thus promoting a reduction of the entire area of the CDR circuit.

We note, that in some instances, as would be apparent to those skilled in the relevant art to which this invention pertains, a feature or element of one described embodiment may be used singly or in combination with other features or elements of another embodiment, unless otherwise specifically indicated.

Although various embodiments have been described for illustrative purposes, it will be apparent to those skilled in the art that various changes and modifications may be made without departing from the spirit and scope of the disclosure as defined in the following claims.

What is claimed is:

1. A clock data recovery circuit comprising:
    a phase comparison circuit configured to compare input data with a phase of a multi-phase clock to generate an up/down signal corresponding to the comparison result;
    a filtering circuit configured to count the up/down signal based on an upper threshold value and a lower threshold value, set, after an overflow occurs, the lower threshold value to an initial value for counting of the up/down signal, an after an underflow occurs, the upper threshold value to the initial value for counting of the up/down signal, and generate a control code corresponding to one of the underflow and the overflow; and
    a phase rotating circuit configured to adjust the phase of the multi-phase clock in response to the control code outputted from the filtering circuit.

2. The clock data recovery circuit of claim 1, wherein the filtering circuit comprises:
    a prediction circuit configured to predict, based on the up/down signal and a sum signal, an underflow/overflow, generate a loop output signal indicating occurrence of one of the underflow and the overflow, output a select signal for selecting the lower threshold value when the overflow occurs, and select the upper threshold value when the underflow occurs;
    a counting circuit configured to count, based on the upper threshold value and the lower threshold value, the up/down signal, output the sum signal, and set, after the underflow or overflow occurs, an initial value of the sum signal in response to the selected signal; and
    a control code generation circuit configured to output the control code based on the loop output signal.

3. The clock data recovery circuit of claim 2, wherein the prediction circuit generates, when the up/down signal indicating an up state is inputted in a state in which the sum signal has reached the upper threshold value, the loop output signal indicating occurrence of the overflow and outputs the select signal for selecting the lower threshold value.

4. The clock data recovery circuit of claim 2, wherein the prediction circuit generates, when the up/down signal indicating a down state is inputted in a state in which the sum signal has reached the lower threshold value, the loop output signal indicating occurrence of the underflow and outputs the select signal for selecting the upper threshold value.

5. The clock data recovery circuit of claim 2, wherein the counting circuit comprises:
    an adder configured to add the up/down signal and the sum signal and output a preliminary sum signal;
    a multiplexer configured to select and output, in response to the select signal, one of the preliminary sum signal, the lower threshold value and the upper threshold value; and
    a plurality of flip-flops configured to latch, in synchronization with a digital operating clock, an output signal of the multiplexer to output the sum signal.

6. The clock data recovery circuit of claim 2, wherein the control code generation circuit comprises:
    an accumulator configured to accumulate and add, in synchronization with a digital operating clock, the loop output signal to output an accumulation signal;
    a decoder configured to decode the accumulation signal to generate a decoded signal; and
    an output circuit configured to synchronize the decoded signal with the digital operating clock to output the control code.

7. The clock data recovery circuit of claim 1, wherein the phase rotating circuit comprises:
    a clock selector configured to select, in response to some bits of the control code, two clocks among a plurality of input clocks to output the two clocks as first and second selected clocks; and
    a phase interpolator configured to mix, in response to the other bits of the control code, the first and second selected clocks to generate the multi-phase clock.

8. The clock data recovery circuit of claim 1, wherein the phase comparison circuit comprises:
    a sampler configured to sample the input data using the multi-phase clock to output phase shift information; and
    a phase detector configured to receive the phase shift information and generate the up/down signal corresponding to a period in which data transition occurs.

9. An integrated circuit comprising:
    an up/down signal generation circuit configured to compare a reference signal and a feedback signal to generate an up/down signal including phase shift information;
    an underflow/overflow prediction circuit configured to predict, based on the up/down signal and a sum signal, an underflow/overflow to generate a control code, and output a select signal for selecting a lower threshold value when the overflow occurs, and select an upper threshold value when the underflow occurs;
    a counting circuit configured to count, based on the upper threshold value and the lower threshold value, the up/down signal to output the sum signal, and set, when the underflow or overflow occurs, an initial value of the sum signal in response to the select signal; and
    a feedback circuit configured to generate the feedback signal in response to the control code.

10. The integrated circuit of claim 9, wherein the underflow/overflow prediction circuit generates, when the up/down signal indicating an up state is inputted in a state in which the sum signal has reached the upper threshold value, the control code indicating occurrence of the overflow and outputs the select signal for selecting the lower threshold value.

11. The integrated circuit of claim 9, wherein the underflow/overflow prediction circuit generates, when the up/down signal indicating a down state is inputted in a state in which the sum signal has reached the lower threshold value, the control code indicating occurrence of the underflow and output the select signal for selecting the upper threshold value.

12. The integrated circuit of claim 9, wherein the counting circuit comprises:
   an adder configured to add the up/down signal and the sum signal to output a preliminary sum signal;
   a multiplexer configured to select and output, in response to the select signal, one of the preliminary sum signal, the lower threshold value and the upper threshold value; and
   a plurality of flip-flops configured to latch, in synchronization with a digital operating clock, an output signal of the multiplexer to output the sum signal.

13. The integrated circuit of claim 9, wherein the feedback circuit comprises:
   a clock selector configured to select, in response to some bits of the control code, two clocks among a plurality of input clocks to output the two clocks as first and second selected clocks; and
   a phase interpolator configured to mix, in response to the other bits of the control code, the first and second selected clocks to generate the feedback signal.

14. A clock data recovery circuit comprising:
   a data transition detection circuit configured to receive input data, detect transition of the input data based on a multi-phase clock, and generate transition information indicating the transition of the input data;
   a digital circuit configured to count the transition information, and generate one of overflow information and underflow information, the overflow information indicating an overflow corresponding that the transition information is counting by an upper threshold value and the underflow information indicating an underflow corresponding that the transition information is counting by a lower threshold value; and
   a phase adjusting circuit configured to adjust the phase of the multi-phase clock for controlling timing of output data corresponding to the input data based on the one of the overflow information and the underflow information,
   wherein the digital circuit sets the lower threshold value to an initial value for counting after the overflow occurs, and sets the upper threshold value to the initial value for counting after an underflow occurs.

15. The clock data recovery circuit of claim 14, wherein the digital circuit comprises:
   a counting circuit configured to count the transition information with the initial value;
   a prediction circuit configured to predict one of the overflow and the underflow based on the transition information and the counting result by the counting, and generate one of the overflow information and the underflow information; and
   a control code generation circuit configured to output a control code corresponding to the one of the overflow information and the underflow information.

16. The clock data recovery circuit of claim 15, wherein the prediction circuit generates, when the transition information indicating an up state is inputted in a state in which the counting result has reached the upper threshold value, the control code indicating occurrence of the overflow, and
   the prediction circuit generates, when the transition information indicating a down state is inputted in a state in which the counting result has reached the lower threshold value, the control code indicating occurrence of the underflow.

* * * * *